United States Patent
Zhang

(10) Patent No.: US 8,569,718 B2
(45) Date of Patent: Oct. 29, 2013

(54) CHARGED PARTICLE BEAM SYSTEM

(75) Inventor: Tao Zhang, Cambridge (GB)

(73) Assignee: Nanobeam Limited, Cambridge (GB)

( * ) Notice: Subject to any disclaimer, the term of this patent is extended or adjusted under 35 U.S.C. 154(b) by 551 days.

(21) Appl. No.: 12/913,403

(22) Filed: Oct. 27, 2010

(65) Prior Publication Data

US 2011/0147618 A1 Jun. 23, 2011

(30) Foreign Application Priority Data

Dec. 23, 2009 (GB) .................................. 0922447.8

(51) Int. Cl.
| | |
|---|---|
| *H01J 37/20* | (2006.01) |
| *H01L 21/673* | (2006.01) |
| *H01L 21/677* | (2006.01) |
| *B25J 21/00* | (2006.01) |
| *H01J 37/18* | (2006.01) |

(52) U.S. Cl.
CPC ............. *H01J 37/185* (2013.01); *H01L 21/673* (2013.01); *H01L 21/67742* (2013.01); *H01L 21/67745* (2013.01); *B25J 21/00* (2013.01)
USPC ..................... 250/492.2; 250/442.11; 414/217

(58) Field of Classification Search
CPC ................................ H01J 37/185; B25J 21/00
USPC ...................................... 414/217; 250/442.11
See application file for complete search history.

(56) References Cited

U.S. PATENT DOCUMENTS

| | | | |
|---|---|---|---|
| 5,442,163 A | 8/1995 | Nakahara et al. | |
| 5,611,655 A * | 3/1997 | Fukasawa et al. | ............ 414/217 |
| 5,658,115 A | 8/1997 | Yamazaki et al. | |
| 6,053,980 A | 4/2000 | Suda et al. | |
| 6,092,485 A * | 7/2000 | Ando et al. | ............. 118/723 VE |
| 6,712,907 B1 | 3/2004 | Pratt et al. | |
| 7,009,683 B2 * | 3/2006 | Sato | ................................ 355/53 |
| 7,119,877 B2 * | 10/2006 | Takita | ............................. 355/53 |
| 2004/0013501 A1 | 1/2004 | Ackeret et al. | |
| 2008/0237486 A1 * | 10/2008 | Zhang | ......................... 250/491.1 |

FOREIGN PATENT DOCUMENTS

| | | |
|---|---|---|
| EP | 0840355 | 5/1998 |
| GB | 2414858 A | 12/2005 |
| GB | 2415291 A | 12/2005 |
| JP | 58-40759 | 3/1983 |
| JP | 58139436 | 8/1983 |
| JP | 4285168 | 10/1992 |
| JP | 10-310241 | 11/1998 |
| WO | WO 2005/119363 | 12/2005 |
| WO | WO 2006/032930 | 3/2006 |

* cited by examiner

*Primary Examiner* — Jack Berman
(74) *Attorney, Agent, or Firm* — Stroock & Stroock & Lavan, LLP

(57) ABSTRACT

In the embodiment a charged particle beam system includes a main chamber, an exchange chamber, an x-y positioning stage housed in the main chamber, a substrate-supporting structure supported by or provided by said stage and moveable in first and second perpendicular directions of travel between limits which define a field of travel and a substrate handling device housed inside the main chamber for loading and unloading a substrate into and out of the main chamber, the device comprising a bar and a side member for supporting the substance to one side of the bar. A method of loading a substrate in a charged particle beam system is also disclosed.

15 Claims, 7 Drawing Sheets

CHARGED PARTICLE BEAM SYSTEM

CROSS-REFERENCE TO PRIOR APPLICATION

This application claims priority under 35 U.S.C. 119 to Great Britain Patent Application No. 0922447.8, filed on Dec. 23, 2009, which is hereby incorporated by reference in its entirety.

FIELD OF INVENTION

The present invention relates to a substrate handling and positioning apparatus for use in a charged particle beam system, such as an electron-beam lithography system, and a charged particle beam system including a substrate handling and positioning apparatus.

SUMMARY

According to a first aspect of the present invention there is provided a charged particle beam system including a main chamber, an exchange chamber, an x-y positioning stage housed in the main chamber, a substrate-supporting structure supported by or provided by said stage and moveable in first and second perpendicular directions of travel between limits which define a field of travel and a substrate handling device housed inside the main chamber for loading and unloading a substrate into and out of the main chamber, the device comprising a bar and a side member, the substrate handling device configured to translate the bar along its longitudinal axis parallel to the first direction of travel and the side member extending laterally from the bar, parallel to the second direction, for supporting the substrate to one side of the bar, wherein the substrate-supporting structure has a loading/unloading position at a limit of travel along the first direction and a limit of travel along the second direction, wherein the substrate-supporting structure and the substrate handling device are positioned so that the substrate can be lifted up from and set down on the substrate-supporting structure when the substrate-supporting structure is in the loading/unloading position and when the side member is in a loading/unloading position, wherein the substrate-supporting structure and/or a substrate supported by the substrate-supporting structure has a part which is closest to the limit of travel in the second direction and which defines a line extending along the second direction which is the limit of extent of the part towards the limit of travel in the first direction, wherein the side member is shaped so that, when it is in its loading/unloading position lies, it does not cross the line.

Thus, the substrate-supporting structure is free to move in the second direction without the side member interfering with the substrate-supporting structure and/or a substrate.

The substrate-supporting structure may comprise a laser interferometer mirror assembly. The substrate-supporting structure may comprise a base and three or more supports upstanding from base. The substrate-supporting structure part which is closest to the limit of travel in the second direction and which defines the line extending along the second direction may be an edge or corner of a support.

The substrate includes a substrate support (or "chuck").

The substrate-supporting structure may include three or more grooves for receiving respective feet of a substrate support.

The first direction may be the x-axis and the second direction may be the y-axis.

The wing may have an edge which furthest away from the exchange chamber along the first direction which, inside the field of travel, is straight along the second direction. The wing may have an edge which is generally further away from the exchange chamber along the first direction which, inside the field of travel, is stepped or sloped, but which does not cross the line defined by the substrate-supporting structure part which is closest to the limit of travel in the second direction. The wing may have an edge which furthest away from the rest of the substrate-exchange device along the second direction which is straight along the first direction. The wing may have an edge which is generally closest to the exchange chamber along the first direction which, inside the field of travel, is stepped or sloped.

The wing may be configured to lie under the substrate. The wing may include three or more grooves for receiving respective feet of a substrate support.

According to a second aspect of the present invention there is provided a method of loading a substrate in a charged particle beam system, the method comprising positioning a substrate-supporting structure in a loading position, positioning a substrate handling device in a loading position, lowering the substrate handling device or raising the substrate-supporting structure so as to set the substrate down onto the substrate-supporting structure and moving the substrate-supporting structure from its loading position without moving the substrate handling device from its loading position.

The substrate-supporting structure may be movable in first and second orthogonal directions, wherein the substrate handling device is moveable in the first direction, but not the second direction and wherein moving the substrate-supporting structure from its loading position comprises initially moving the substrate-supporting structure in the second direction, optionally, only in the second direction.

BRIEF DESCRIPTION OF THE DRAWINGS

Certain embodiments of the present invention will now be described, by way of example, with reference to the accompanying drawings in which.

DETAILED DESCRIPTION OF CERTAIN EMBODIMENTS

Figure 1:
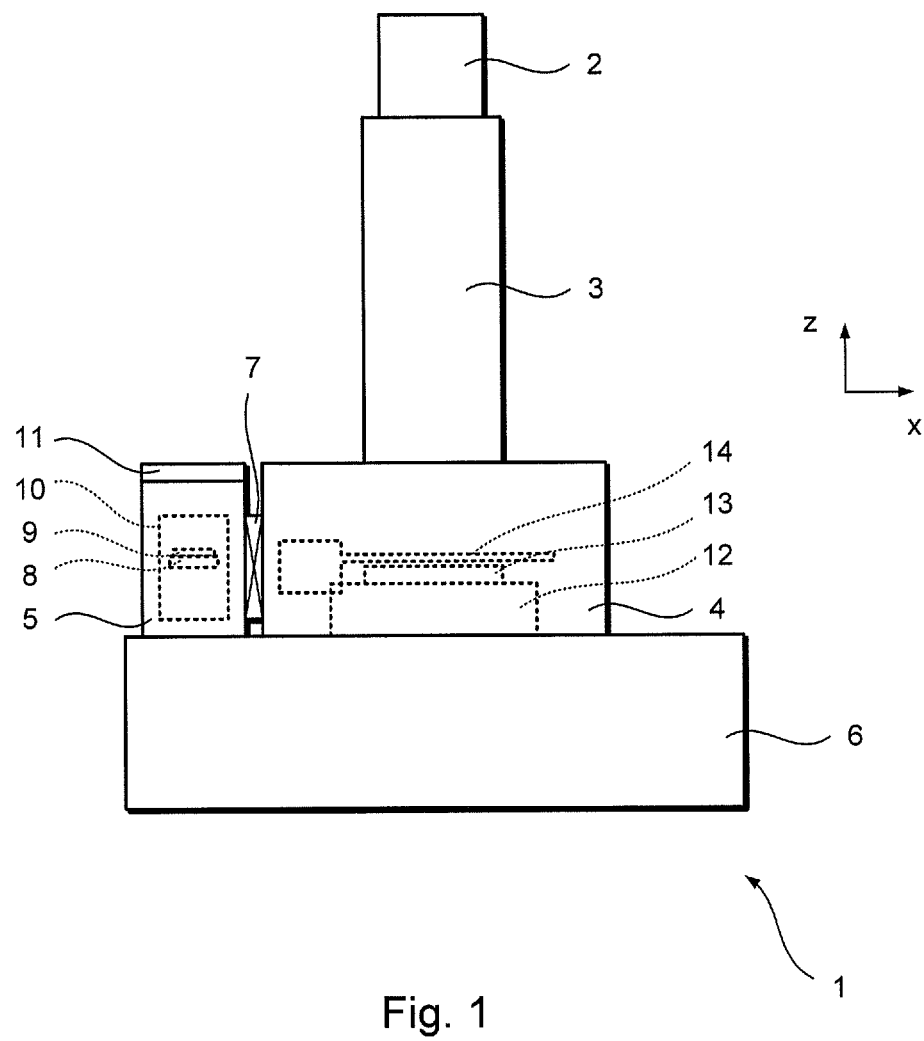
FIG. 1 is a schematic view of an electron-beam lithography system.

Referring to FIG. 1, an electron-beam lithography system 1 is shown. The electron-beam lithography system 1 includes a gun 2, a column 3, a main chamber 4, an exchange chamber 5 and a vacuum system 6.

The main chamber 4 and the exchange chamber 5 are connected by a gate valve 7. When the gate valve 7 is open, a substrate support 8, referred to herein as a chuck 8, carrying a substrate 9 can be passed between the chambers 4, 5 through the gate valve 7. The exchange chamber 5 houses a cassette 10 which can hold a plurality of chucks 8, each chuck 8 supporting a respective substrate 9. However, only one chuck 8 and one substrate 9 are shown in FIG. 1 for clarity. The exchange chamber 5 is provided with a lid 11 for allowing cassettes 10 to be switched.

The substrate 9 can be a wafer, such as a semiconductor wafer. The substrate 9 may be a mask (or "reticle").

When the gate valve 7 is closed, the exchange chamber 5 can be vented to atmospheric pressure and opened to allow one cassette 10 to be removed and replaced by another. Once the cassette 10 has been placed in the exchange chamber 5, the exchange chamber 5 is re-evacuated. The gate valve 7 can then be opened to permit the chuck 8 to be loaded into the main chamber 4. Thus, the main chamber 4 is not vented while the cassette 10 is replaced.

The main chamber 4 houses an x-y positioning stage 12 supporting a laser interferometer mirror assembly 13. The laser interferometer mirror assembly 13 supports the chuck 8, which in turn supports the substrate 9 while the substrate 9 is exposed to an electron beam (not shown).

The main chamber 4 also houses a substrate handling device 14 (or "robot") for loading and unloading the chuck 8 supporting a substrate 9 into and out of the chamber 4.

Figure 2:
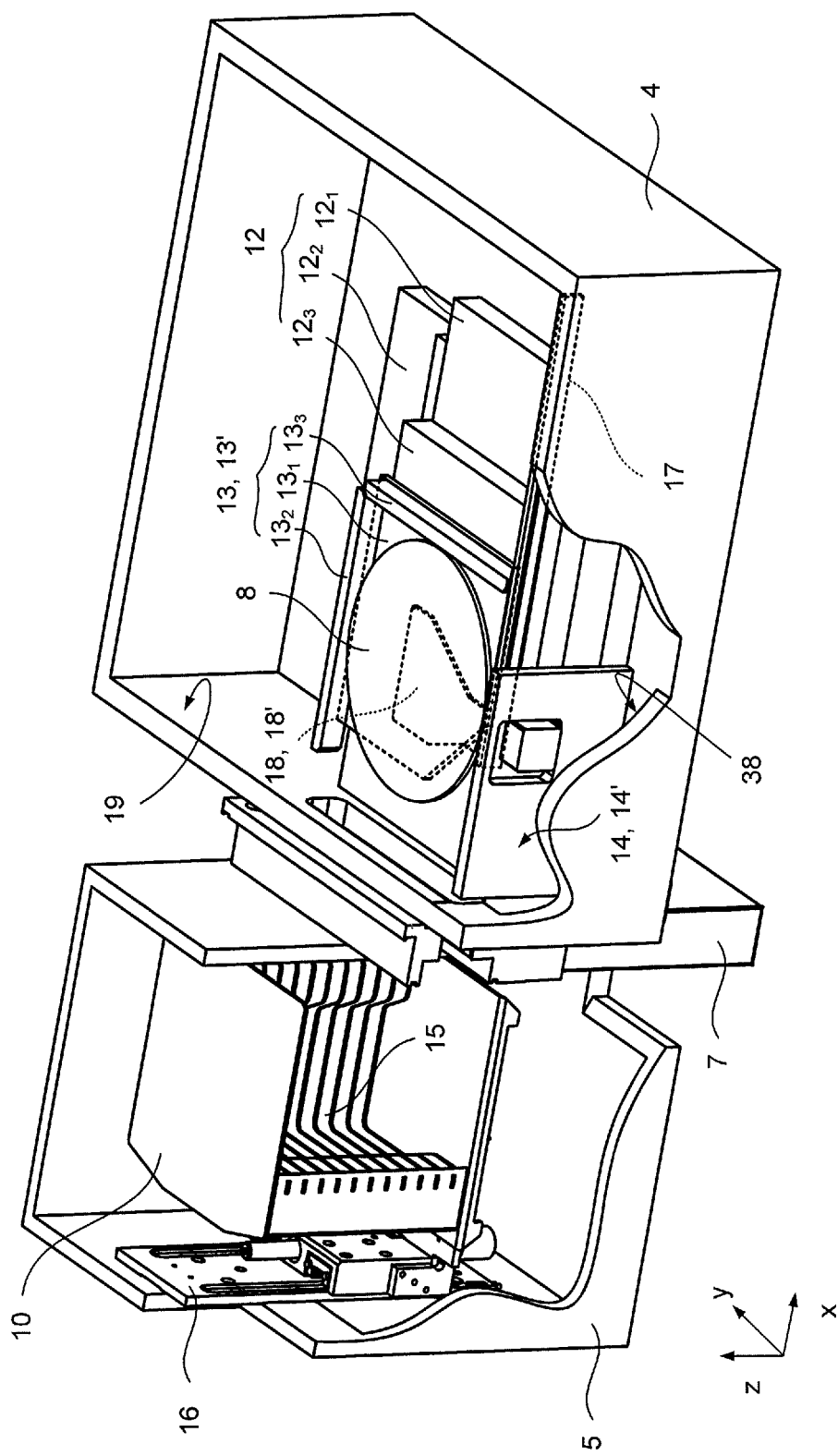
FIG. 2 is a perspective view of a main chamber and an exchange chamber of the electron-beam lithography system shown in FIG. 1.

Referring to FIG. 2, the main chamber 4 and the exchange chamber 5 are shown in more detail.

The cassette 10 has a plurality of vertically-stacked shelves 15 for holding respective chucks (not shown). The cassette 10 can be raised and lowered by a lifting mechanism 16 driven by a motor (not shown). The lifting mechanism 16 permits the robot 14 to access each chuck (not shown) in the cassette 10.

The x-y positioning stage 12 comprises a base $12_1$ and first and second platforms or tables $12_2$, $12_3$. The first platform $12_2$ can move in a first orthogonal direction, for example along the x-axis, with respect to the base $12_1$ and the second platform $12_3$ can move in a second orthogonal direction, in this case along the y-axis, with respect to the first platform $12_2$. The first and second platforms $12_2$, $12_3$ are driven by respective stepper motors (not shown).

The laser interferometer mirror assembly 13 comprises a base $13_1$ and first and second orthogonal mirror blocks $13_2$, $13_3$. The mirror assembly 13 co-operates with an interferometer unit (not shown) to determine the position of the mirror assembly 13 and, thus, the chuck 8.

As will be explained in more detail later, the mirror assembly 13 is configured to receive and support the chuck 8. However, the mirror assembly 13 may be omitted and the x-y positioning stage 12 or other supporting structure may be arranged to receive and to support the chuck 8 directly.

The robot 14 includes a bar 17 and a side member 18 extending laterally from the bar 17 for supporting the chuck 8 and the substrate 9 to one side of the bar 17. The side member 18 is disposed close to one end of the bar 17. The side member 18 is in the form of a cantilevered wing.

The robot 14 is arranged such that the bar 17 can be raised and extended forwards so that the bar 17 and the side member 18 pass through an aperture in a wall 19 of the main chamber 4 and through gate valve 7 into the exchange chamber 5. The bar 17 can be raised to pick up a chuck 8 from a shelf 15. The bar 17 can then be withdrawn back into the main chamber 4 and lowered to set the chuck 8 onto the mirror assembly 13.

Further details about the robot 14 can be found in WO2006/032930 A which is incorporated herein by reference.

Figure 3:
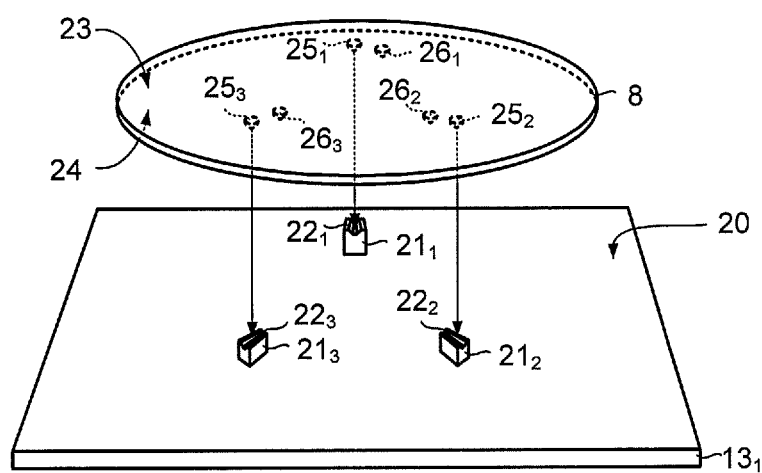
FIG. 3 is an exploded view of the support and laser interferometer mirror assembly of the electron-beam lithography system shown in FIG. 1.

Referring also to FIG. 3, the interferometer mirror base $13_1$ has an upper surface 20 and providing a plurality of supports $21_1$, $21_2$, $21_3$ upstanding from the upper surface 20. For clarity, the mirror blocks are not shown. The top of the supports $21_1$, $21_2$, $21_3$ are shaped to form grooves $22_1$, $22_2$, $22_3$ which provide radial tracks.

The chuck 8 is in the form of a substantially circular flat disk having a first flat face 23, i.e. a top surface, for receiving a workpiece and a second flat face 24, i.e. an underside. In some embodiments, the chuck 8 can be rectangular (in plan view), e.g. square, for example to support a rectangular workpiece. The chuck 8 has two sets of feet $25_1$, $25_2$, $25_3$, $26_1$, $26_2$, $26_3$ attached to the underside 24. Each set comprises at least three feet $25_1$, $25_2$, $25_3$, $26_1$, $26_2$, $26_3$ and each foot $25_1$, $25_2$, $25_3$, $26_1$, $26_2$, $26_3$ is in the form of a spherical segment fused or bonded to the underside 24 of the chuck 8.

The supports $21_1$, $21_2$, $21_3$ and one of the sets of feet $25_1$, $25_2$, $25_3$ are arranged such that the feet $25_1$, $25_2$, $25_3$ sit in respective grooves $22_1$, $22_2$, $22_3$ of the supports $21_1$, $21_2$, $21_3$ when the chuck 8 is placed on the mirror assembly 13. In this way, the mirror assembly 13 can receive and support the chuck 8.

Further details about the seating arrangement can be found in WO2005/119363 A which is incorporated herein by reference.

Figure 4:
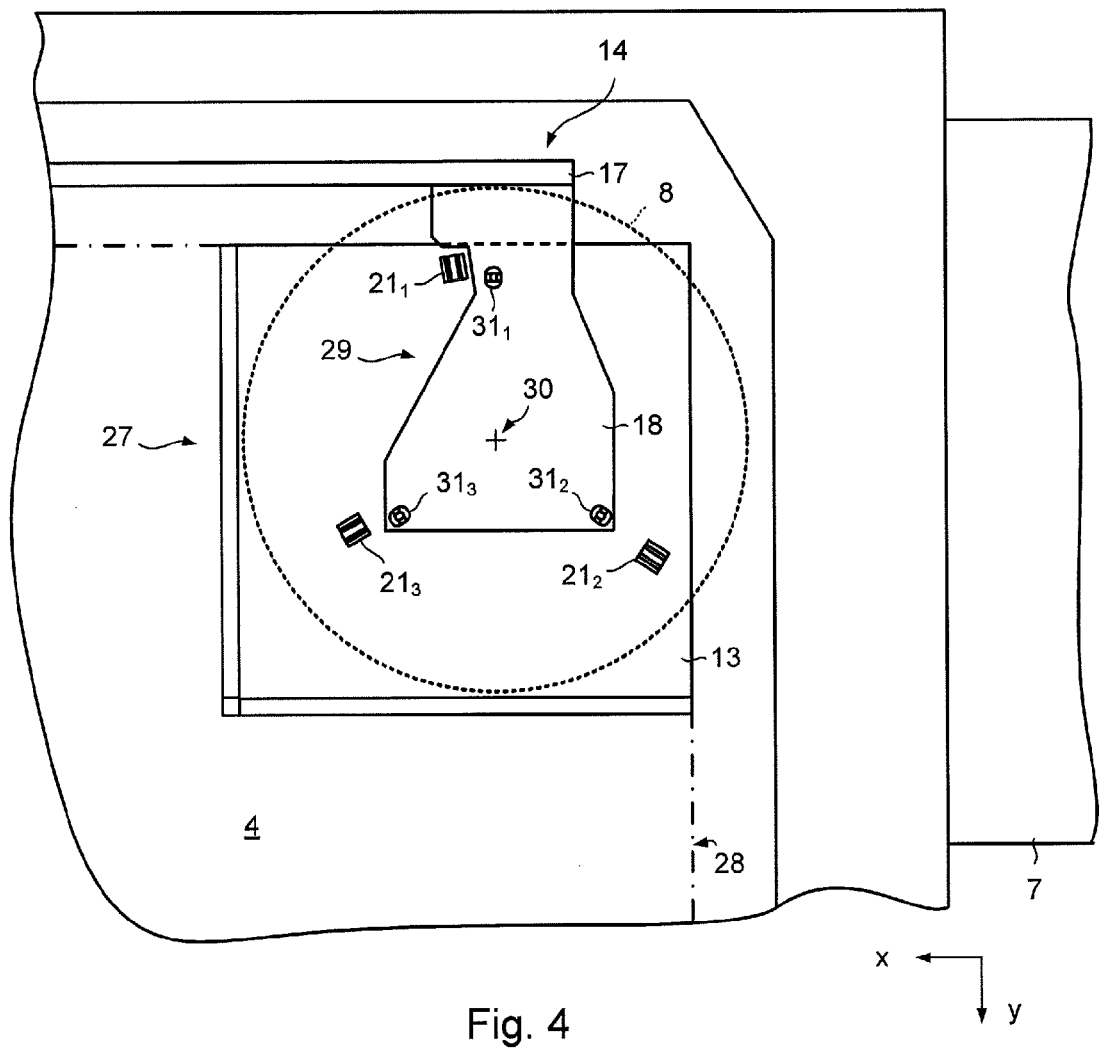
FIG. 4 is a plan viewing showing the robot and the laser interferometer mirror assembly of the electron beam lithography system shown in FIG. 1.
Figure 4A:
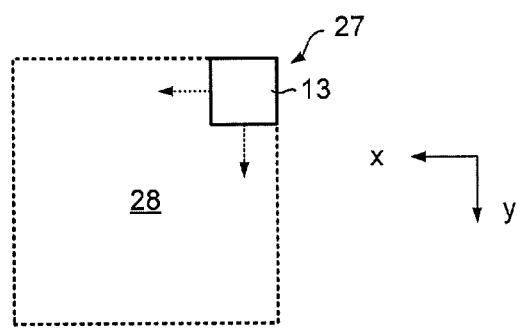
FIG. 4a is a schematic plan view of the field of travel of the laser interferometer mirror assembly shown in FIG. 4.

Referring to FIGS. 4 and 4a, the laser interferometer mirror assembly 13 is shown when it is at a loading/unloading position 27 close to the gate 7. The loading/unloading position 27 is at the limits of travel of the x-y positioning stage 12 (FIG. 2) during normal operation. As shown in FIG. 4a, the limits of travel define an extent or field of travel 28 for the mirror assembly 13 during normal operation. It may, however, be possible to move the stage further during servicing.

FIG. 4 also shows the robot 14 at its loading/unloading position 29 in the main chamber 4. The robot loading/unloading position 29 is at the limit of travel of the robot 14.

As shown in FIG. 4, the side member 18 of the robot 14 lies substantially within an area defined by the supports $21_1$, $21_2$, $21_3$. The side member 18 is shaped and the chuck 8 is positioned on the side member 18 so that the centre of mass 30 of the chuck 8 falls well within an area bounded by the side member 18. Thus, the chuck 8 is properly supported by the side member 18. As shown in FIG. 4, the side member 18 include a set of grooves $31_1$, $31_2$, $31_3$ which provide radial tracks which can seat the second set of feet $26_1$, $26_2$, $26_3$ (FIG. 3) of the chuck 8.

The robot 14 shown in FIG. 4 suffers a drawback which is common to loading/unloading robots, namely the need to move to a park position after loading a workpiece so as to avoid the robot interfering with the substrate positioning system. In most cases, the robot is located outside the main chamber.

Figure 5:
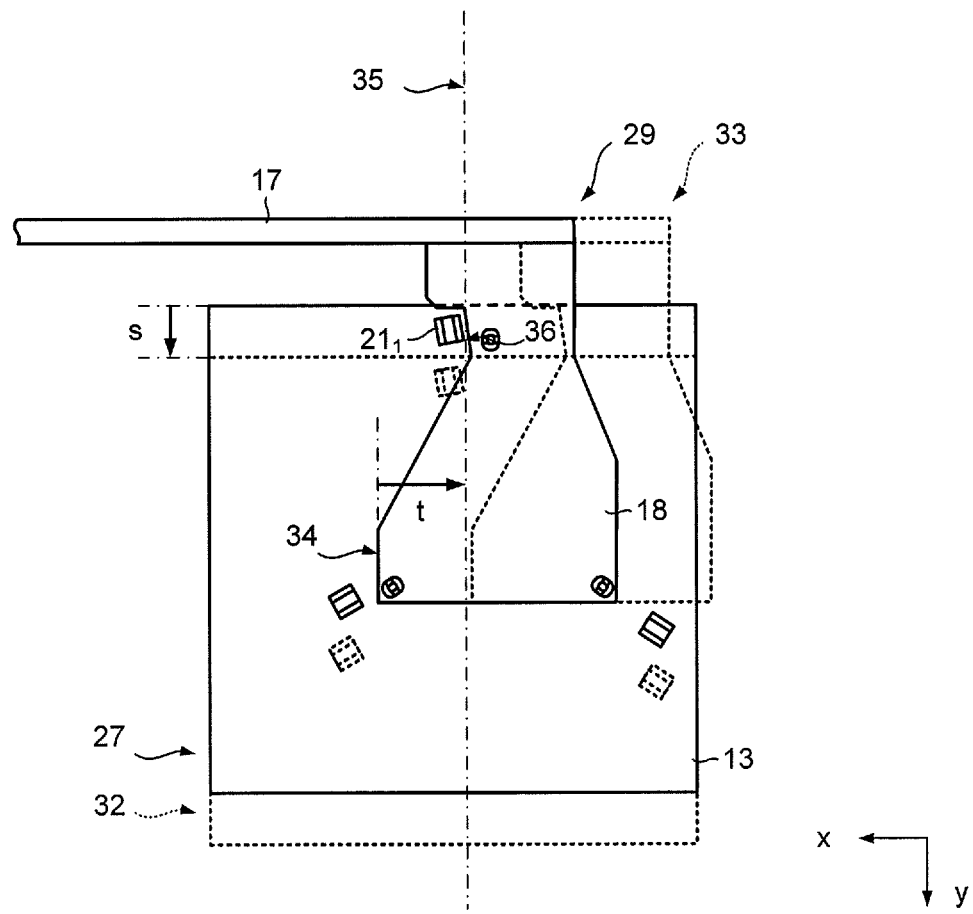
FIG. 5 illustrates movement of the laser interferometer mirror assembly shown in FIG. 4.

Referring to FIG. 5, with the robot arm 17 located at its loading/unloading position 29, the laser interferometer mirror assembly 13 is not free to move directly along the y-axis from its loading/unloading position 27 by a distance, s, to a new position 32.

Therefore, before the x-y position stage 12 (FIG. 2) can move the mirror assembly 13, the robot 14 must move its arm 17 by a distance, t, directly along the x-direction to a park position 33.

In doing so, the arm 17 is moved sufficiently far that the innermost edge or point 34 of the wing 18 along the x-axis passes beyond a line or limit 35 defined by the outermost point 36, in the same direction (i.e. the x-axis), of the outermost support $21_1$ along the orthogonal direction of travel, i.e. along the y-axis.

The terms "innermost" and "outermost" are defined relative to the field of travel 28 (FIG. 4a) of the mirror assembly 13, when in its park position 27. Position along the x-direction can also be expressed in relation to the exchange chamber. Therefore, the "outermost" edge corresponds to an edge which is closest to the exchange chamber along the x-direction. Conversely, "innermost" edge corresponds to an edge which is furthest away from the exchange chamber. Likewise, position along the y-direction can also be expressed in relation to the robot. Therefore, the "outmost" edge corresponds to an edge which is closest to the robot (or rest of the robot) along the y-direction.

Once the arm 17 and the wing 18 have been moved sufficiently far so as not to interfere with movement of the mirror assembly 13, then the mirror assembly 13 can be moved. In other words, the wing 18 is effectively moved outside a field of travel of the support $21_1$.

Parking can have disadvantages. Firstly, parking a robot takes time. Moreover, if the robot is located inside the main chamber, additional space is needed to accommodate the robot when parked.

The mirror assembly 13 and robot 14 described earlier can be modified to avoid the need for moving the robot arm to a park position.

Figure 6:
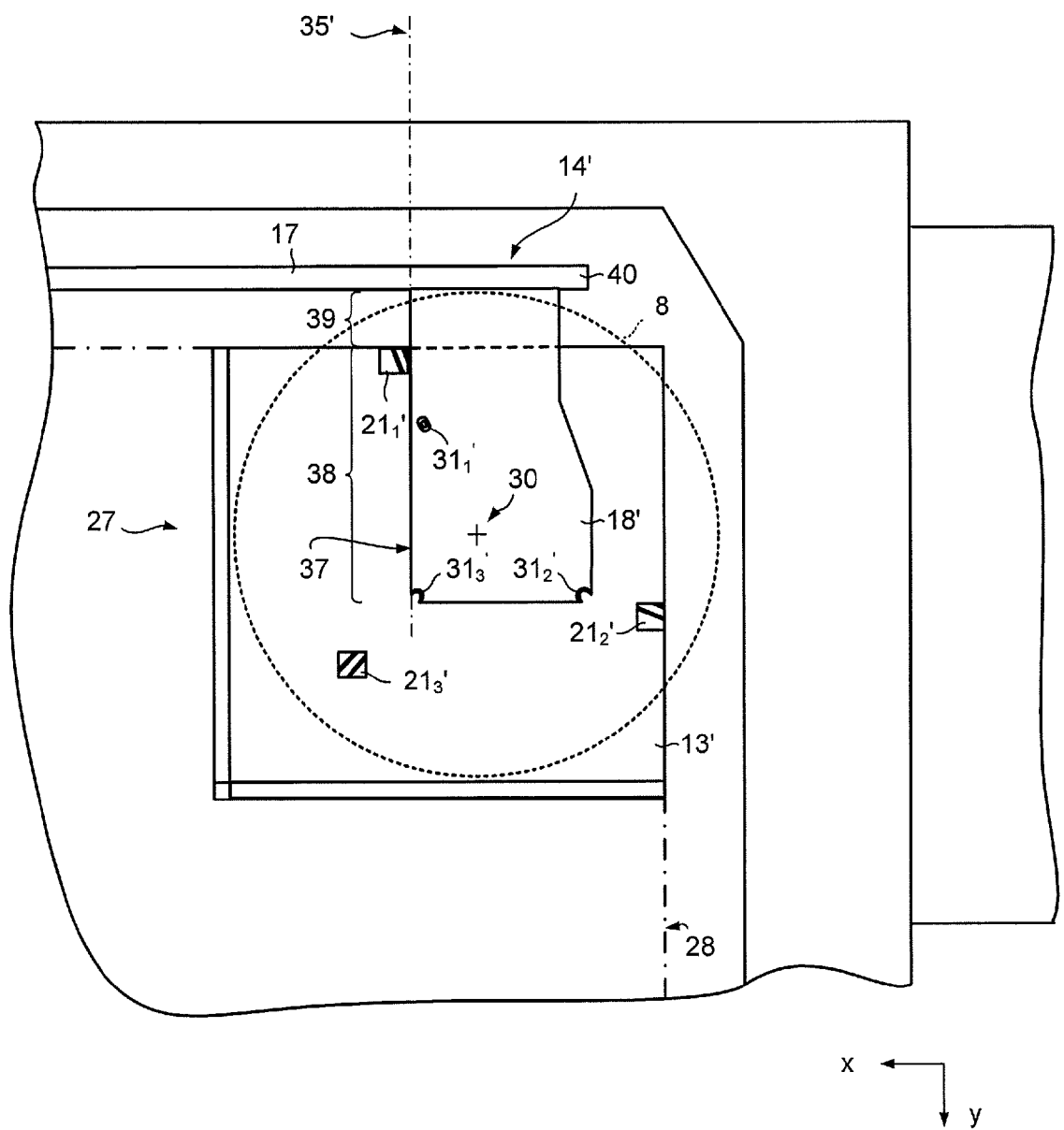
FIG. 6 is a plan viewing showing a modified robot and modified laser interferometer mirror assembly in accordance with the present invention.

Referring to FIG. 6, a modified mirror assembly 13' and modified robot 14' in accordance with the present invention is shown. With the exception of the chuck 8, the other parts of the electron-beam lithography system 1 (FIGS. 1 & 2) need not be modified. In this example, the other parts of the electron-beam lithography system 1 (FIGS. 1 & 2) are substantially the same and so will not be described again in detail.

As shown in FIG. 6, the modified robot 14' has a modified wing 18' (herein after simply referred to as "the wing") having a different shape (in plan view). The wing 18' has a non-interfering edge 37 which is extends furthest into the field of travel 28 along the x-direction. Hereinafter, this edge 37 is referred to simply as the innermost edge 37.

In this example, the innermost edge 37 is straight along the width (i.e. in the y-direction) of the wing 18'. The edge 37 runs orthogonal or perpendicular to direction of movement to the arm 17, which is along the x-axis. The edge 37 runs parallel to the y-direction of movement of the modified laser interferometer mirror assembly 13'.

The wing 18' need not be straight along its entire width. For example, the edge 37 can be straight along a portion 38 (herein referred to an "inside portion", i.e. inside the field of travel 28) from a modified innermost support $21_1$' on the mirror assembly 13'. Thus, another portion 39 of the edge 37 of the wing 18' outside the field of travel between the support $21_1$' and the arm 17 can extend further inwardly, i.e. away from a distal end 40 of the arm 17.

Even the inside portion 38 of the edge 37 of the wing 18' need not be straight. However, in this case, the edge 37 should extend outwardly, i.e. towards the edge of the field of travel 28 in the x-direction (i.e. towards the distal end of the arm 17) so that no part protrudes and crosses line 35'.

As also shown in FIG. 6, the wing 18' has a modified set of grooves $31_1$', $31_2$', $31_3$'. Second and third grooves $31_2$', $31_3$' are open ended and located at the corners of the wing 18', at the furthest possible extremes of the wing 18' so as to provide maximum stability when the chuck 8 is supported.

As shown in FIG. 6, the modified laser interferometer mirror assembly 13' (herein after simply referred to as "the mirror assembly") has a modified set of supports $21_1$', $21_2$', $21_3$'. The modified supports $21_1$', $21_2$', $21_3$' are generally rotated clockwise as a set compared to the supports $21_1$, $21_2$, $21_3$ shown in FIG. 4. The square-based modified supports $21_1$', $21_2$', $21_3$' are also individually rotated so that their edges lie along the orthogonal directions of the movement of the mirror assembly 13'. The modified supports $21_1$', $21_2$', $21_3$' still have radial grooves, but the grooves can be offset from the centre of the supports $21_1$', $21_2$', $21_3$'.

The modified supports $21_1$', $21_2$', $21_3$' are positioned so that the first modified support $21_1$' does not catch the wing 18' when the mirror assembly is moved in the y-direction, i.e. such that the wing does not cross the line 35' and, thus, the innermost edge 37 does not interfere with the first support $21^{1\prime}$. The modified supports $21_1$', $21_2$', $21_3$' are also positioned so that the second modified support $21_2$' does not catch the wing 18' when the mirror assembly is moved in the x-direction or when the arm 17 is moved during loading and unloading, i.e. the a (y) innermost edge 40 does not interfere with the second support $21^{2\prime}$. The modified supports $21_1$', $21_2$', $21_3$' are positioned at points with sufficient angular separation so as to provide adequate support for the chuck 8. These parameters in combination tend to constrain how far the modified supports $21_1$', $21_2$', $21_3$' can be rotated.

Figure 7:
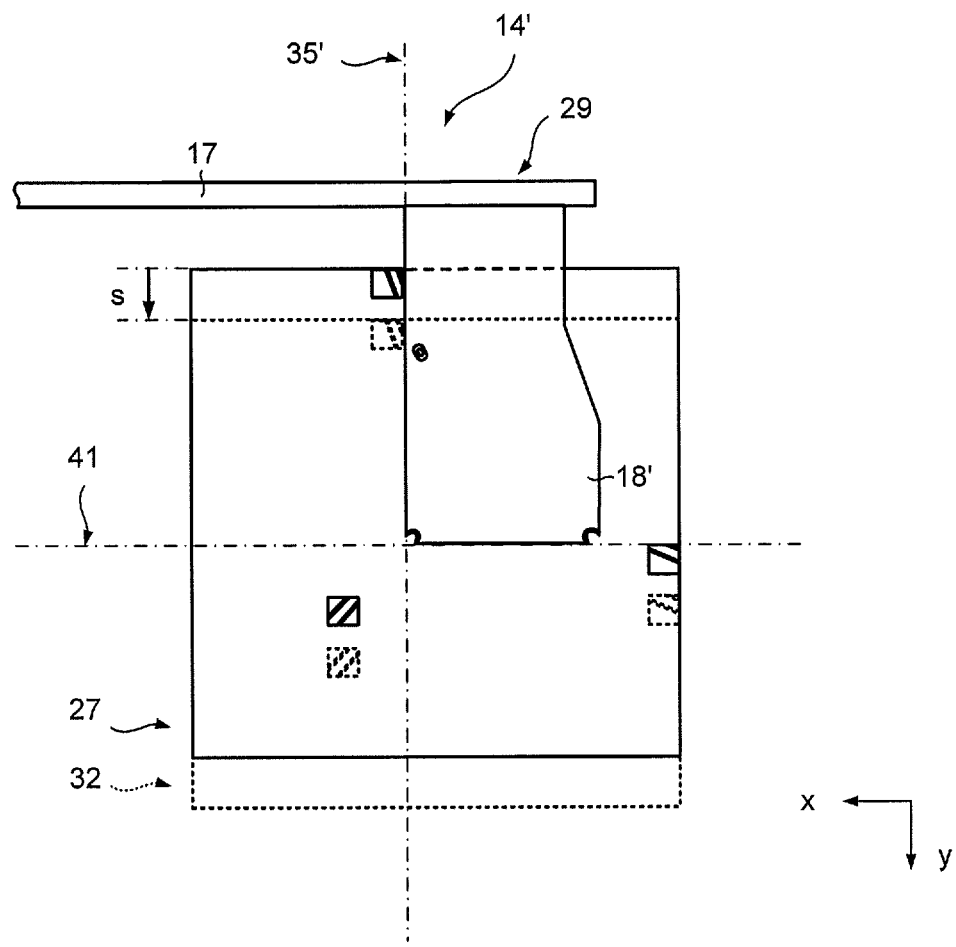
FIG. 7 illustrates movement of the laser interferometer mirror assembly shown in FIG. 6.

Referring to FIG. 7, with the arm 17 of the modified robot 14' located at its loading/unloading position 29, the modified laser interferometer mirror assembly 13' is free to move directly along the y-axis from its loading/unloading position 27 by a distance, s, to a new position 32. Moreover, the robot 14' is free to move the arm 17 and the wing 18' to and from its loading/unloading position 29.

Thus, in effect, the x-y coordinates of the robot's loading/unloading position 29 is the same as the x-y coordinates of the robot's park position.

It will be appreciated that many modifications may be made to the embodiments hereinbefore described.

For example, the chuck need not be supported by a laser interferometer mirror assembly. Instead, the chuck can be supported by another moveable supporting structure, e.g. a table of the x-y positioning stage.

A chuck need not be used. For example, a workpiece can be supported directly by the moveable supporting structure.

A different seating arrangement can be used. For example, the workpiece or other workpiece support need not have feet and the moveable supporting structure need not have grooved supports. The supporting structure may have pillars or pins on which the workpiece (or workpiece support can be placed). Alternatively, the supporting structure need not have any upstanding members and the workpiece (or workpiece support) can have legs.

Although an electron beam lithography system is described, the system can be any type of charged particle beam system, e.g. an ion-beam system. Moreover, the charge particle beam need not be used for lithography, but can be used for analysis, e.g. microscopy.

The invention claimed is:

1. A charged particle beam system including:
   a main chamber;
   an exchange chamber;
   an x-y positioning stage housed in the main chamber;
   a substrate-supporting structure supported by or provided by said stage and moveable in first and second perpendicular directions of travel between limits which define a field of travel; and
   a substrate handling device housed inside the main chamber for loading and unloading a substrate into and out of the main chamber, the device comprising a bar and a side member, the substrate handling device configured to translate the bar along its longitudinal axis parallel to the first direction of travel and the side member extending laterally from the bar, parallel to the second direction, for supporting the substrate to one side of the bar;

wherein the substrate-supporting structure has a loading/unloading position at a limit of travel along the first direction and a limit of travel along the second direction, wherein the substrate-supporting structure and the substrate handling device are positioned so that the substrate can be lifted up from and set down on the substrate-supporting structure when the substrate-supporting structure is in the loading/unloading position and when the side member is in a loading/unloading position;

wherein the substrate-supporting structure and/or a substrate supported by the substrate-supporting structure has a part which is closest to the limit of travel in the second direction and which defines a line extending along the second direction which is the limit of extent of the part towards the limit of travel in the first direction, wherein the side member is shaped so that, when it is in its loading/unloading position lies, it does not cross the line, whereby the substrate-supporting structure is free to move in the second direction without the side member interfering with the substrate-supporting structure and/or a substrate.

2. A system according to claim 1, wherein the substrate-supporting structure comprises a laser interferometer mirror assembly.

3. A system according to claim 1, wherein the substrate-supporting structure comprises a base and three or more supports upstanding from base.

4. A system according to claim 3, wherein the substrate-supporting structure part which is closest to the limit of travel in the second direction and which defines the line extending along the second direction is an edge or corner of a support.

5. A system according to claim 1, wherein the substrate includes a substrate support.

6. A system according to claim 1, wherein the substrate-supporting structure includes three or more grooves for receiving respective feet of a substrate support.

7. A system according to claim 1, wherein the first direction is the x-axis and the second direction is the y-axis.

8. A system according to claim 1, wherein the wing has an edge which furthest away from the exchange chamber along the first direction which, inside the field of travel, is straight along the second direction.

9. A system according to claim 1, wherein the wing has an edge which is generally further away from the exchange chamber along the first direction which, inside the field of travel, is stepped or sloped, but which does not cross the line defined by the substrate-supporting structure part which is closest to the limit of travel in the second direction.

10. A system according to claim 1, wherein the wing has an edge which furthest away from the rest of the substrate-exchange device along the second direction which is straight along the first direction.

11. A system according to claim 1, wherein the wing has an edge which is generally closest to the exchange chamber along the first direction which, inside the field of travel, is stepped or sloped.

12. A system according to claim 1, wherein the wing is configured to lie under the substrate.

13. A system according to claim 1, wherein the wing includes three or more grooves for receiving respective feet of a substrate support.

14. A method of loading a substrate in a charged particle beam system, the method comprising:
    positioning a substrate-supporting structure in a loading position;
    positioning a substrate handling device in a loading position;
    lowering the substrate handling device or raising the substrate-supporting structure so as to set the substrate down onto the substrate-supporting structure; and
    moving the substrate-supporting structure from its loading position without moving the substrate handling device from its loading position.

15. A method according to claim 14, wherein the substrate-supporting structure is movable in first and second orthogonal directions, wherein the substrate handling device is moveable in the first direction, but not the second direction and wherein moving the substrate-supporting structure from its loading position comprises initially moving the substrate-supporting structure in the second direction, optionally, only in the second direction.

* * * * *